United States Patent
Zhang

(10) Patent No.: US 11,464,143 B2
(45) Date of Patent: Oct. 4, 2022

(54) HEAT DISSIPATION DEVICE OF DISPLAY APPARATUS AND METHOD FOR DISSIPATING HEAT OF DISPLAY APPARATUS, AND DISPLAY DEVICE

(71) Applicant: Xiamen Tianma Micro-Electronics Co., Ltd., Xiamen (CN)

(72) Inventor: Xiaoyin Zhang, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 53 days.

(21) Appl. No.: 17/111,180

(22) Filed: Dec. 3, 2020

(65) Prior Publication Data

US 2021/0092883 A1 Mar. 25, 2021

(30) Foreign Application Priority Data

Sep. 30, 2020 (CN) .......................... 202011062659.1

(51) Int. Cl.
G06F 1/20 (2006.01)
G06F 1/16 (2006.01)
H05K 7/20 (2006.01)

(52) U.S. Cl.
CPC ....... *H05K 7/20972* (2013.01); *G06F 1/1632* (2013.01); *G06F 1/203* (2013.01); *H05K 7/20145* (2013.01); *H05K 7/20209* (2013.01)

(58) Field of Classification Search
CPC ............................... G06F 1/203; G06F 1/1632
See application file for complete search history.

(56) References Cited

U.S. PATENT DOCUMENTS 9,454,183 B2 * 9/2016 Suckle .................. G06F 1/1632
2003/0128510 A1 * 7/2003 Anzai ....................... G06F 1/18
361/679.48

(Continued)

FOREIGN PATENT DOCUMENTS

CN 203590649 U 5/2014
CN 203734995 U 7/2014

(Continued)

OTHER PUBLICATIONS

Zeng; Jian, "Vehicle mobile phone heat dissipation type gravity support", Apr. 16, 2019, Entire Document (Translation of CN 208745913) (Of record, cited in IDS, including Original Copy). (Year: 2019).*

(Continued)

*Primary Examiner* — Stephen S Sul
(74) *Attorney, Agent, or Firm* — Christensen O'Connor Johnson Kindness PLLC

(57) ABSTRACT

A heat dissipation device of a display apparatus and a method for dissipating heat of a display apparatus, and a display device are provided. The heat dissipation device includes a front cover assembly including a front cover, a support assembly including a support base, and a rear cover assembly including a rear cover and a heat dissipation component. The front cover is provided with a heat dissipation control switch and a receiving groove configured to receive the display apparatus. The support base is slidably mounted in first sliding grooves respectively provided on both sides of the receiving groove. The rear cover is provided with an air inlet and an air outlet. When the display apparatus is inserted into the receiving groove, the support base slides under weight of the display apparatus, to press the heat dissipation control switch, to control the heat dissipation component to dissipate heat.

20 Claims, 10 Drawing Sheets

(56) References Cited

U.S. PATENT DOCUMENTS

| | | | |
|---|---|---|---|
| 2004/0261422 A1* | 12/2004 | McEuen | G06F 1/20 |
| | | | 62/3.2 |
| 2012/0137038 A1* | 5/2012 | Huang | G06F 1/1632 |
| | | | 710/303 |
| 2013/0107126 A1* | 5/2013 | Nonomura | H04N 5/64 |
| | | | 361/679.41 |
| 2014/0098486 A1* | 4/2014 | Davis | G06F 1/1607 |
| | | | 361/679.41 |
| 2016/0360644 A1* | 12/2016 | Bains | H04M 1/0262 |
| 2017/0090531 A1* | 3/2017 | Forbes | G06F 1/26 |
| 2018/0004250 A1* | 1/2018 | Barnett | G06F 1/1688 |

FOREIGN PATENT DOCUMENTS

| | | |
|---|---|---|
| CN | 109002100 A | 12/2018 |
| CN | 208745913 U | 4/2019 |
| CN | 209546187 U | 10/2019 |

OTHER PUBLICATIONS

Zhang; Yanfang, "Heat dissipation protection box for communication information equipment", Hebi Automotive ENG Professional College, Oct. 25, 2019, Entire Document (Translation of CN 209546187) (Of record, cited in IDS, including Original Copy). (Year: 2019).*

State Intellectual Property Office of the People's Republic of China, First Office Action, Chinese Patent Application No. 202011062659.1, 17 pages.

* cited by examiner

HEAT DISSIPATION DEVICE OF DISPLAY APPARATUS AND METHOD FOR DISSIPATING HEAT OF DISPLAY APPARATUS, AND DISPLAY DEVICE

CROSS-REFERENCE TO RELATED DISCLOSURES

The present application claims priority to Chinese Patent Disclosure No. 202011062659.1, filed on Sep. 30, 2020, the content of which is incorporated herein by reference in its entirety.

TECHNICAL FIELD

The present disclosure relates to the field of display technologies and, in particular, to a heat dissipation device of a display apparatus and a method for dissipating heat of a display apparatus, and a display device.

BACKGROUND

With the continuous development of display technologies, users have higher and higher requirements for display performance of display apparatuses, and consequently, power consumption and heat dissipation of the display apparatuses have become larger and larger. Especially, for handheld display apparatuses, the heat dissipation of the display apparatus is even larger when the user is playing games or watching videos, and if heat emitted by the display apparatus cannot be dissipated in time, it will cause the display apparatus to be overheated, thereby causing damage to the display apparatus.

To this end, it is required to carry out corresponding heat dissipation designs for this type of display apparatuses. In related designs, the heat dissipation device usually needs to be controlled manually. For example, when heat dissipation is required, the user needs to manually turn on a heat dissipation control switch of the heat dissipation device to achieve heat dissipation, and when heat dissipation is not required, the user also needs to manually turn off the heat dissipation control switch to stop heat dissipation, resulting in poor user experience.

SUMMARY

In one aspect, an embodiment of the present disclosure provides a heat dissipation device of a display apparatus, including:

a front cover assembly including a front cover, wherein the front cover is provided with a receiving groove and a heat dissipation control switch, wherein the receiving groove is configured to receive the display apparatus, and the receiving groove is provided with first sliding grooves respectively located on both sides of the receiving groove;

a support assembly including a support base, wherein the support base is slidably mounted in the first sliding grooves and is located at a side of the heat dissipation control switch facing away from a bottom of the front cover; and a rear cover assembly including a rear cover and a heat dissipation component, wherein the rear cover is provided with an air inlet and an air outlet, where when the display apparatus is inserted into the receiving groove, the support base slides under weight of the display apparatus in such a manner that the heat dissipation control switch is pressed to control the heat dissipation component to dissipate heat.

In another aspect, an embodiment of the present disclosure provides a display device, including the heat dissipation device described above and the display apparatus using the heat dissipation device to dissipate heat.

In yet another aspect, an embodiment of the present disclosure provides a method for dissipating heat of a display apparatus, the method includes using the heat dissipation device according to claim 1 to dissipate heat for the display apparatus. The using the heat dissipation device to dissipate heat for the display apparatus includes: when the display apparatus is inserted into the receiving groove, the support base sliding under weight of the display apparatus in such a manner that the heat dissipation control switch is pressed to control the heat dissipation component to dissipate heat; and when the display apparatus is pulled out of the receiving groove, contact between the support base and the heat dissipation control switch being disconnected in such a manner that the heat dissipation control switch is turned off to control the heat dissipation component to stop dissipating heat.

BRIEF DESCRIPTION OF DRAWINGS

In order to more clearly illustrate technical solutions of embodiments of the present disclosure, the accompanying drawings used in the embodiments are briefly described below. The drawings in the following description are only some embodiments of the present disclosure, and for those of ordinary skill in the art, other drawings can be obtained based on these drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. Based on the embodiments of the present disclosure, other embodiments obtained by those of ordinary skill in the art fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is merely an association describing the associated object, indicating that there may be three relationships. For example, A and/or B may indicate three cases: A alone; A and B; B alone. In addition, a character "/" herein generally indicates that the contextual objects are in an "or" relationship.

It should be understood that although the terms first, second, and third can be used to describe sliding grooves in the embodiments of the present disclosure, these sliding grooves should not be limited to these terms, and these terms are only used to distinguish the sliding grooves from each other. For example, without departing from the scope of the embodiments of the present disclosure, the first sliding groove can also be referred to as the second sliding groove, and similarly, the second sliding groove can also be referred to as the first sliding groove.

Depending on the context, the word "if" as used herein can be interpreted as "when" or "at the time of" or "in response to determination" or "in response to detection".

Similarly, depending on the context, the phrase "if determined" or "if detected (statement or event)" can be interpreted as "when determined" or "in response to determination" or "when detected (statement or event)" or "in response to detection (statement or event)".

Figures 1A, 1B, 1C:
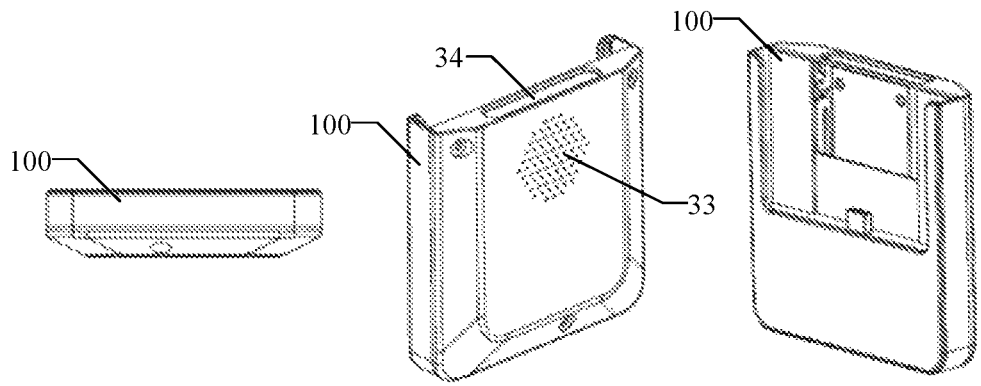
FIG. 1A-FIG. 1F illustrate a schematic diagram of a heat dissipation device at different angles according to an embodiment of the present disclosure.
Figures 1D, 1E, 1F:
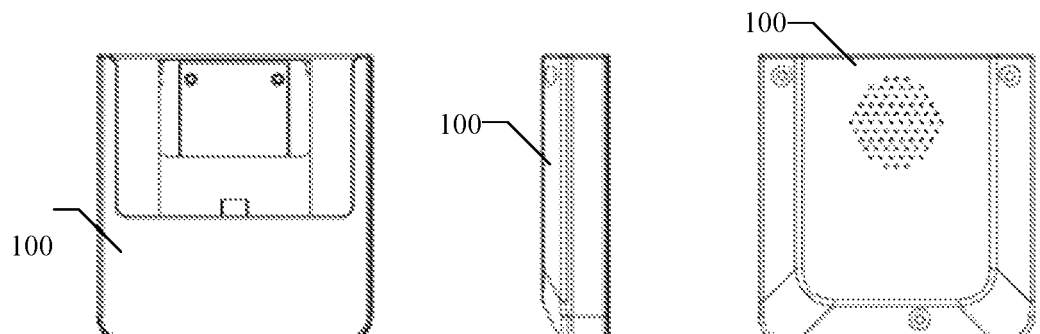
Figures 2A, 2B:
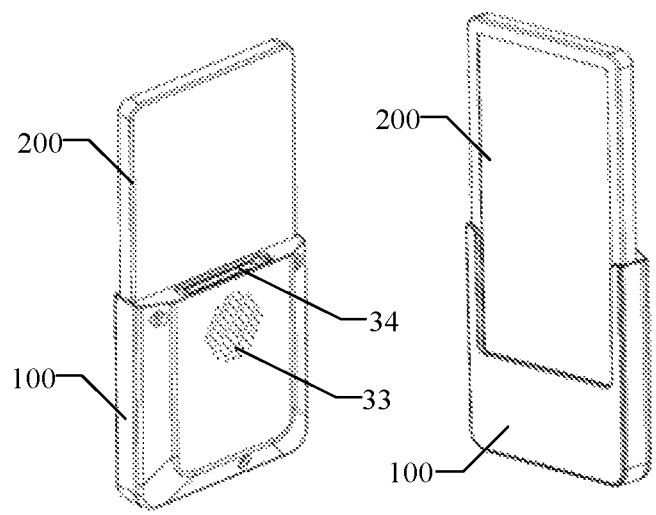
FIG. 2A-FIG. 2B illustrate a schematic diagram of a heat dissipation device with a display apparatus being inserted therein at different angles according to an embodiment of the present disclosure.

An embodiment of the present disclosure provides a heat dissipation device of a display apparatus, as shown in FIG. 1A-FIG. 1F and FIG. 2A-FIG. 2B, FIG. 1A-FIG. 1F illustrate a schematic diagram of a heat dissipation device at different angles provided by an embodiment of the present disclosure, and FIG. 2A-FIG. 2B illustrate a schematic diagram of a heat dissipation device with a display apparatus being inserted therein at different angles according to an embodiment of the present disclosure. A heat dissipation device 100 is configured to dissipate heat for a display apparatus 200, such as a handheld display apparatus.

Figure 3:
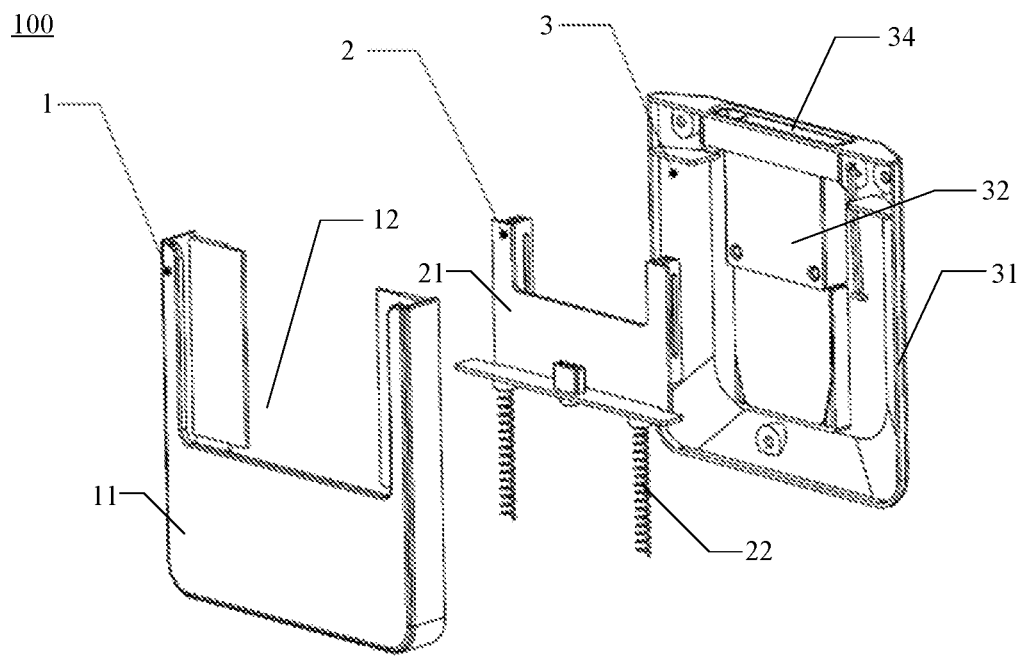
FIG. 3 illustrates an exploded schematic diagram of a heat dissipation device according to an embodiment of the present disclosure.
Figure 4:
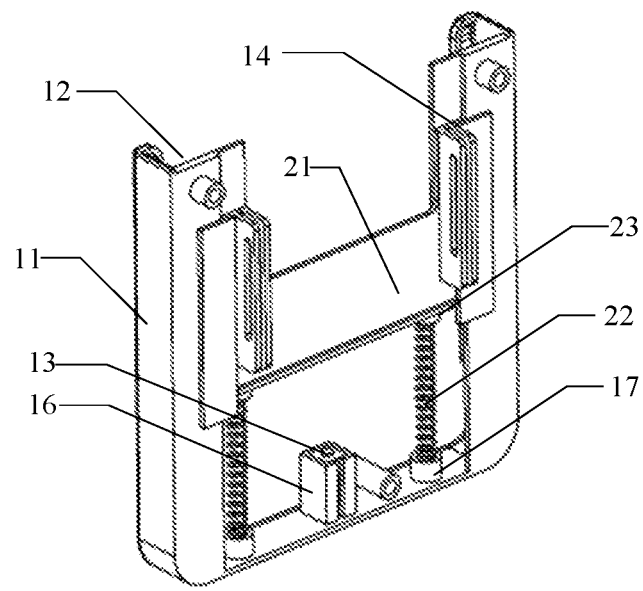
FIG. 4 illustrates a rear diagram of a heat dissipation device after assembling a front cover assembly and a support assembly according to an embodiment of the present disclosure.
Figure 5:
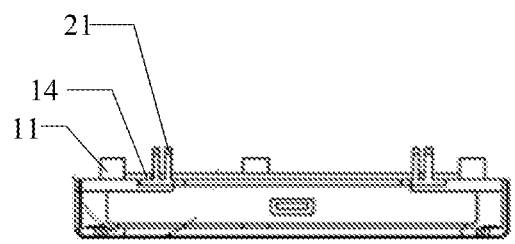
FIG. 5 illustrates a bottom diagram of a heat dissipation device after assembling a front cover assembly and a support assembly according to an embodiment of the present disclosure.

FIG. 3 illustrates an exploded schematic diagram of a heat dissipation device provided by an embodiment of the present disclosure, FIG. 4 illustrates a rear diagram of a heat dissipation device after assembling a front cover assembly and a support assembly provided by an embodiment of the present disclosure, and FIG. 5 illustrates a bottom diagram of a heat dissipation device after assembling a front cover assembly and a support assembly provided by the embodiment of the present disclosure. As shown in FIGS. 3 to 5, the heat dissipation device 100 includes a front cover assembly 1, a support assembly 2 and a rear cover assembly 3, the front cover assembly 1 includes a front cover 11, the front cover 11 is provided with a receiving groove 12 and a heat dissipation control switch 13, the receiving groove 12 is configured to receive the display apparatus 200, and the receiving groove 12 is provided with first sliding grooves 14 respectively located on both sides of the receiving groove 12. The support assembly 2 includes a support base 21, the support base 21 is slidably mounted on the first sliding groove 14, that is, the support base 21 can slide up and down through the first sliding groove 14, and the support base 21 is located at a side of the heat dissipation control switch 13 facing away from a bottom of the front cover (that is, the support base 21 is located at a side of the heat dissipation control switch 13 facing away from an insertion direction of the display apparatus 200). The rear cover assembly 3 includes a rear cover 31 and a heat dissipation component 32, and with reference to FIGS. 1A to 2, the rear cover 31 is further provided with an air inlet 33 and an air outlet 34. When the display apparatus 200 is inserted into the receiving groove 12, the support base 21 slides under weight of the display apparatus 200, and then press the heat dissipation control switch 13 that is configured to control the heat dissipation component 32 to dissipate heat.

Figure 6:
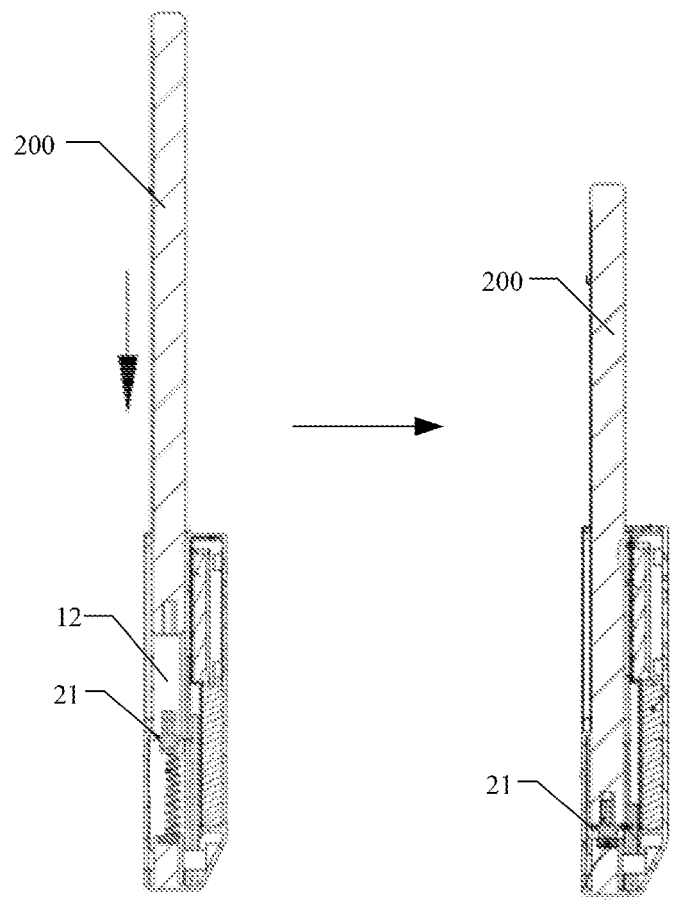
FIG. 6 illustrates a schematic diagram of a state of a display apparatus when moving in a heat dissipation device according to an embodiment of the present disclosure.
Figure 7:
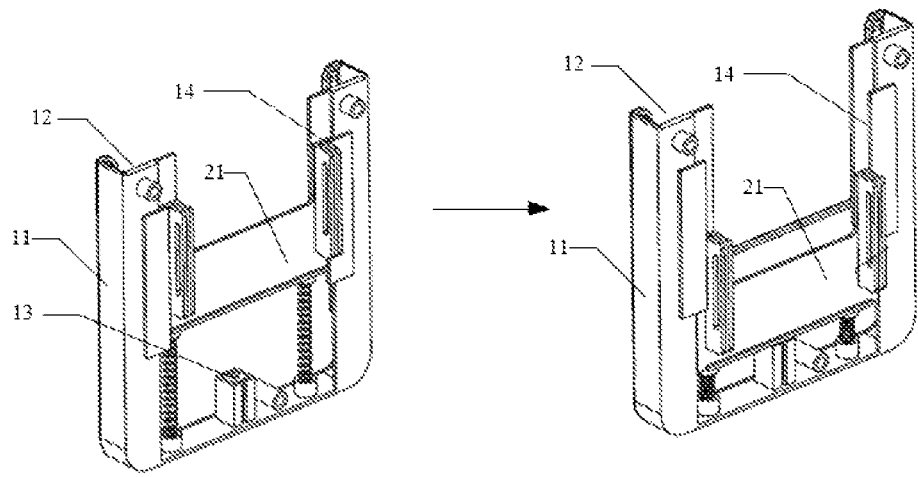
FIG. 7 illustrates schematic diagrams of states of a support base before and after a display apparatus is inserted into a heat dissipation device according to an embodiment of the present disclosure.

FIG. 6 illustrates a schematic diagram of a state when the display apparatus when moving in a heat dissipation device provided by an embodiment of the present disclosure, and FIG. 7 illustrates schematic diagrams of states of the support base before and after the display apparatus is inserted into the heat dissipation device according to the embodiment of the present disclosure. In an embodiment of the present disclosure, as shown in FIG. 6 and FIG. 7, when using the heat dissipation device 100 described above to dissipate heat generated by the display apparatus 200, the display apparatus 200 is inserted into the receiving groove 12 of the front cover assembly 1, a bottom of the display apparatus 200 is pressed on the support base 21, and as the display apparatus 200 inserts into the heat dissipation device 100 deeper and deeper, the support base 21 slides down into the first sliding groove 14 under the weight of the display apparatus 200. When the support base 21 slides to a certain position, the bottom of the support base 21 touches the heat dissipation control switch 13 and presses the heat dissipation control switch 13, so that the heat dissipation control switch 13 is turned on, thereby controlling the heat dissipation component 32 to dissipate heat for the display apparatus 200. After the heat dissipation is finished, the display apparatus 200 is pulled out of the receiving groove 12. As a result, a force exerted by the display apparatus 200 on the support base 21 disappears, and the support base 21 rebounds to its initial position, so that the support base 21 is not in contact with the heat dissipation control switch 13, and thus the heat dissipation control switch 13 moves up and turns off, to control the heat dissipation component 32 to stop dissipating heat.

It can be seen that using the heat dissipation device 100 provided by the embodiment of the present disclosure can, when the display apparatus 200 is inserted into the receiving groove 12, utilize the weight (also referred to as gravitational force) of the display apparatus 200 itself to control the support base 21 to press the heat dissipation control switch 13 so as to realize automatic turning-on of the heat dissipation control switch 13. Furthermore, when the display apparatus 200 is pulled out of the receiving groove 12, the support base 21 is not in contact with the heat dissipation control switch 13, so as to control automatic turning-off of the heat dissipation control switch 13. Therefore, the heat dissipation device 100 provided by the embodiments of the present disclosure can realize automatic heat dissipation based on the own weight of the display apparatus 200, without having to manually turn on or off the heat dissipation control switch 13, thereby simplifying a control method and improving user's experience. Moreover, when the display apparatus is inserted for heat dissipation, the heat dissipation device can use own surface (bottom of the heat dissipation device) to support or add an adjustable support bracket to the heat dissipation device, so that the heat dissipation device supports the display apparatus 200.

In addition, it should be noted that in the embodiment of the present disclosure, after the display apparatus 200 is inserted into the receiving groove 12, the display apparatus 200 slides up and down along both sidewalls of the receiving groove 12, and when the display apparatus 200 is fully inserted into the receiving groove 12, the receiving groove 12 will not block a display screen of the display apparatus 200, so as to ensure that the user can simultaneously operate the display apparatus 200 while dissipating heat for the display apparatus 200, for example, when watching a video or an image on the display apparatus 200 simultaneously, thereby improving user experience.

Figure 8:
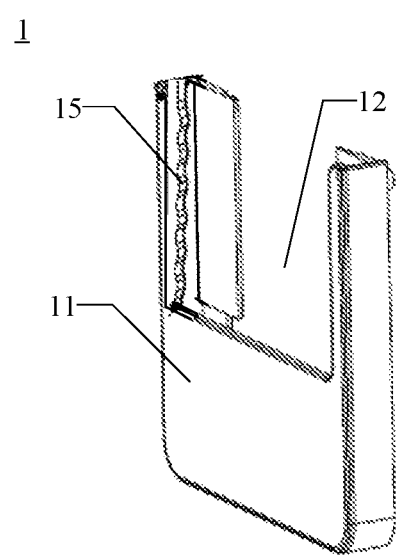
FIG. 8 illustrates a schematic diagram of a front cover assembly according to an embodiment of the present disclosure.

FIG. 8 illustrates another schematic diagram of the front cover assembly provided by the embodiment of the present disclosure. In an embodiment, as shown in FIG. 8, the front cover assembly 1 further includes an anti-slip elastic piece 15 arranged on an inner side of the receiving groove 12. For example, the anti-slip elastic piece 15 is pasted on the inner side of the receiving groove 12 through a double-sided tape, or it is pasted on the sidewall of the receiving groove 12, therefore improving stability of the anti-slip elastic piece 15 and preventing the anti-slip elastic piece 15 from falling off.

By arranging the anti-slip elastic piece 15 on the inner side of the receiving groove 12, when the display apparatus 200 is inserted into the receiving groove 12, the anti-slip elastic piece 15 can increase a friction force applied on the display apparatus 200 during insertion, such that the display apparatus 200 is inserted at a relatively slow speed, to prevent damage to the display apparatus 200 and to the heat dissipation device 100 caused by the display apparatus 200 sliding to the bottom of the receiving groove 12 too quickly, thereby protecting the display apparatus 200 and the heat dissipation device 100.

In an embodiment, referring to FIG. 4 again, the bottom of the front cover 11 is provided with a switch limit part 16, and the heat dissipation control switch 13 is attached to the switch limit part 16 by, for example, glue, so that the switch limit part 16 is used to limit a setting position of the heat dissipation control switch 13.

If the heat dissipation control switch 13 is directly bonded to the bottom of the front cover 11, the setting position of the heat dissipation control switch 13 is too low, and it may happen that when the support base 21 slides to the bottom, the heat dissipation control switch 13 cannot be touched, thereby resulting in that the heat dissipation device cannot implement the heat dissipation. By bonding the heat dissipation control switch 13 on the switch limit part 16, a height of the switch limit part 16 can be used to create a certain height difference between the heat dissipation control switch 13 and the bottom of the front cover 11, therefore avoiding the position of the heat dissipation control switch 13 being too low. As a result, when the support base 21 slides to a certain position under driving of the display apparatus 200, it can be ensured that the bottom of the support base 21 touches the heat dissipation control switch 13, so as to press the heat dissipation control switch 13, to improve the reliability of the automatic control of the heat dissipation control switch 13.

In an embodiment, referring to FIGS. 3 and 4 again, the support assembly 2 further includes springs 22 that are respectively located at both sides of the switch limit part 16. In an embodiment, the bottom of the support base 21 is provided with a first spring limit part 23, the bottom of the front cover 11 is provided with a second spring limit part 17. One end of the spring 22 is fixed on the first spring limit part 23, and the other end of the spring 22 is fixed on the second spring limit part 17.

With such configuration, based on retractable performance of the spring 22, the springs 22 can better drive the support base 21 to press down or rebound. For example, when the display apparatus 200 is pulled out from the receiving groove 12, the support base 21 is no longer subjected to the weight action of the display apparatus 200, in this case, the spring 22 can provide an upward elastic force to the support base 21, to drive the support base 21 to rebound, and to ensure that the support base 21 and the heat dissipation control switch 13 are not in contact with each other. Thereby, the reliability of the automatic control of the heat dissipation control switch 13 is improved. Moreover, by using the first spring limit part 23 and the second spring limit part 17 to fix the setting position of the spring 22, a setting stability of the spring 22 can also be improved, to prevent the position of the spring 22 from changing during expansion and contraction.

Figure 9:
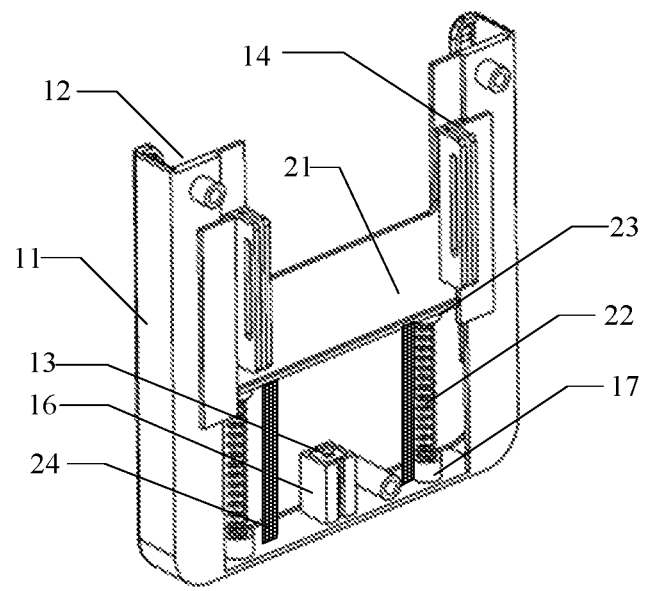
FIG. 9 illustrates a schematic diagram of a support assembly according to an embodiment of the present disclosure.

FIG. 9 illustrates another schematic diagram of the support assembly provided by the embodiments of the present disclosure. In an embodiment, as shown in FIG. 9, the support assembly 2 further includes buffers 24 respectively located at both sides of the switch limit part 16. One end of the buffer 24 is fixed to the bottom of the support base 21, the other end of the buffer 24 is fixed to the bottom of the front cover 11. In operation, a maximum compression length of the buffer 24 is smaller than a height of the switch limit part 16. The buffer 24 can be a damper or a hydraulic buffer.

With such configuration, in one aspect, when the display apparatus 200 drives the support base 21 to slide down, the buffer 24 can buffer sudden changes in stress, to prevent the support base 21 from sliding to the bottom too quickly, so as to prevent the support base 21 from causing an instantaneous relatively large force on the heat dissipation control switch 13, thereby avoiding damage to the heat dissipation control switch 13. In another aspect, if the maximum compression length of the buffer 24 is relatively large, when the support base 21 slides to the maximum compression length of the buffer 24, there is still a certain distance between the support base 21 and the heat dissipation control switch 13, so that the support base 21 may not be able to touch the heat dissipation control switch 13. However, through making the maximum compression length of the buffer 24 smaller than the height of the switch limit part 16, it can ensure that when the bottom of the support base 21 is pressed against the heat dissipation control switch 13 located on the switch limit part 16, the buffer 24 still has a certain compression margin, so as to ensure that the heat dissipation device 100 can automatically perform heat dissipation. In yet another aspect, when the display apparatus 200 is fully inserted into the heat dissipation device 100, the support base 21 is supported on the switch limit part 16, since the maximum compression length of the buffer 24 is smaller than the height of the switch limit part 16, when the weight of the display apparatus 200 is too large, the buffer 24 can provide auxiliary support for the display apparatus 200, which improves support stability of the display apparatus 200.

Figure 10:
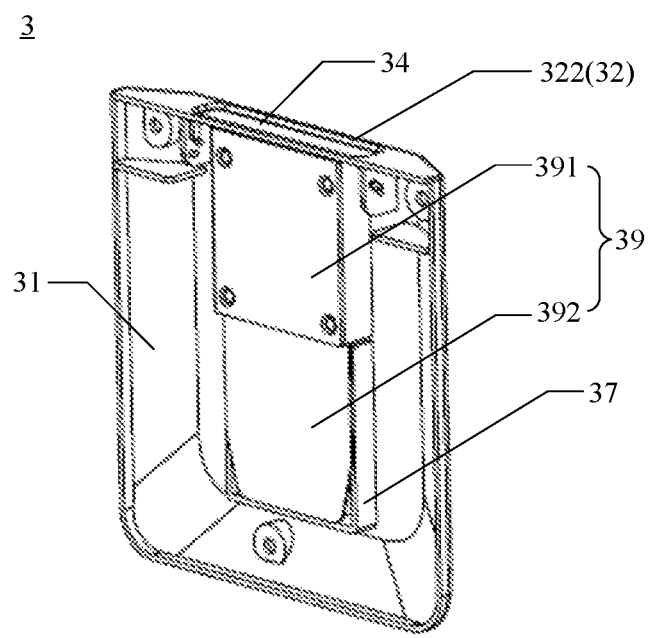
FIG. 10 illustrates a schematic diagram of a rear cover assembly according to an embodiment of the present disclosure.
Figure 11:
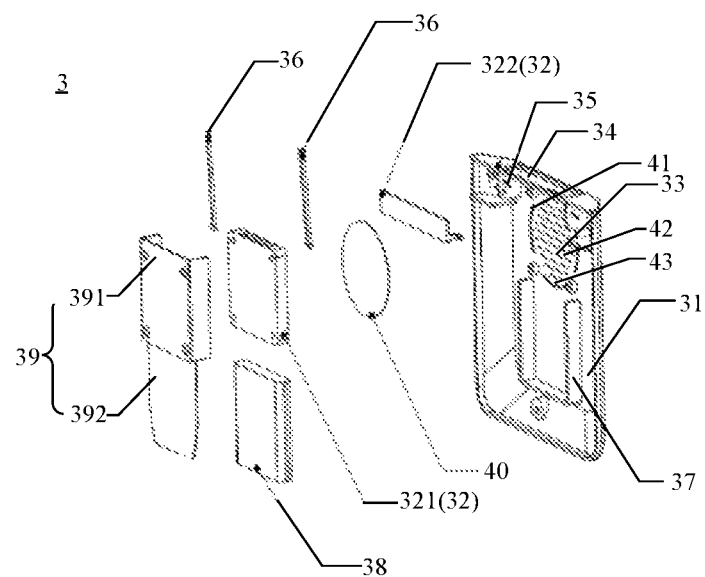
FIG. 11 illustrates an exploded schematic diagram corresponding to FIG. 10.

FIG. 10 illustrates a schematic diagram of a rear cover assembly provided by an embodiment of the present disclosure, and FIG. 11 illustrates an exploded schematic diagram corresponding to FIG. 10. In an embodiment, as shown in FIG. 10 and FIG. 11, the heat dissipation component 32 includes a fan 321 and a blade 322, and the fan 321 is fixed on the rear cover 31 and configured to blow air under the control of the heat dissipation control switch 13. The air outlet 34 is provided with second sliding grooves 35 respectively located at both sides of the air outlet 34. The blade 322 is rotatably installed in the second sliding groove 35 and configured to rotate when the support base 21 slides, to expose the air outlet 34.

Figure 12:
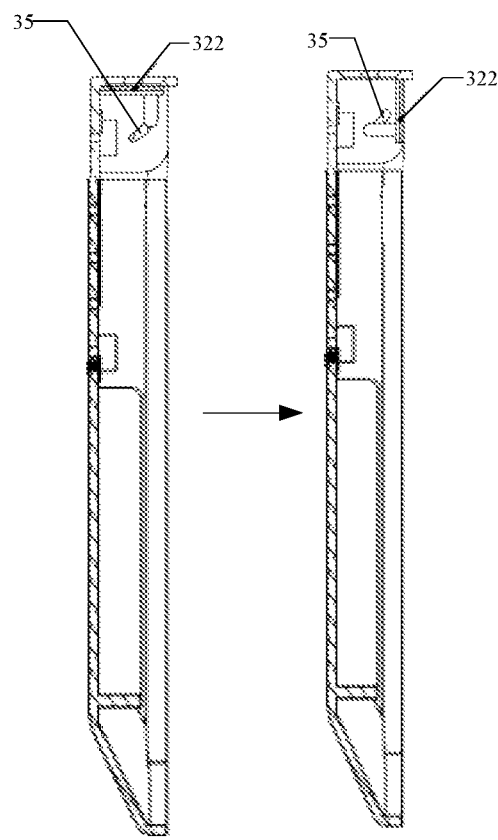
FIG. 12 illustrates a schematic diagram of a state of a blade sliding in a second sliding groove according to an embodiment of the present disclosure.
Figure 13:
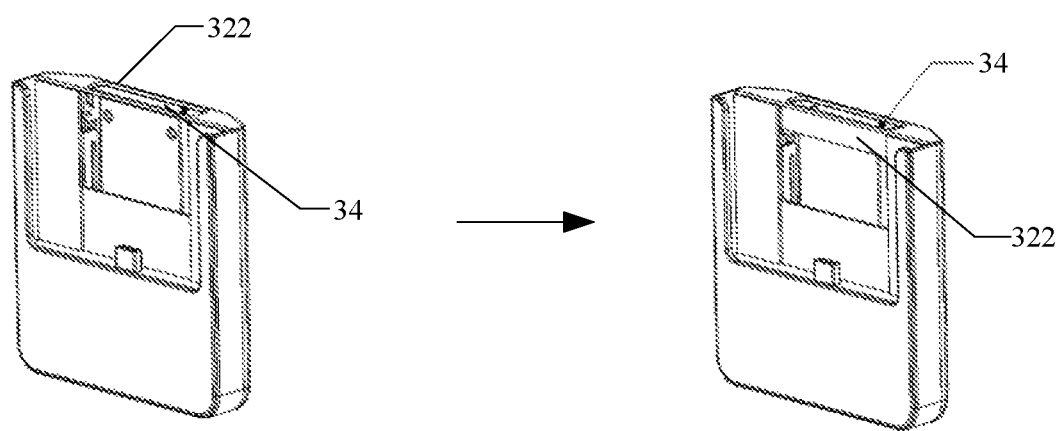
FIG. 13 illustrates schematic diagrams of states of a blade before and after its rotation according to an embodiment of the present disclosure.

In an embodiment, the blade 322 can be inserted to the second sliding grooves 35 through protrusions respectively located on both sides of the blade 322, and the blade 322 is rotatable and slidable relative to the rear cover 31 so as to be in a horizontal or vertical state. FIG. 12 is a schematic diagram of a state of the blade sliding in the second sliding groove according to an embodiment of the present disclosure. FIG. 13 illustrates schematic diagrams of states of a blade before and after rotation according to an embodiment of the present disclosure. With reference to FIG. 12 and FIG. 13, when the display apparatus 200 is not inserted into the receiving groove 12 or pulled out of the receiving groove 12, the blade 322 is in the horizontal state to block the air outlet 34, while when the display apparatus 200 is inserted into the receiving groove 12, the blade 322 slides in the second sliding groove 35 and then is in the vertical state after the rotation to expose the air outlet 34. At the same time, the fan 321 blows air under the control of the heat dissipation control switch 13 to form a heat dissipation path between the air inlet 33 and the air outlet 34, such that the heat generated by the display apparatus 200 is quickly exchanged with the outside atmosphere through the fan 321, to effectively dissipate heat of the display apparatus 200.

In addition, it should be noted that when not using the heat dissipation device 100 to dissipate heat, the blade 322 is in the horizontal state to block the air outlet 34. In this case, the blade 322 can also have improved dustproof and waterproof effects, to prevent dust and water vapor from penetrating into inside of the heat dissipation device 100 from the air outlet 34, thereby preventing the dust and the water vapor from causing adverse effects on internal components of the heat dissipation device 100.

Figure 14:
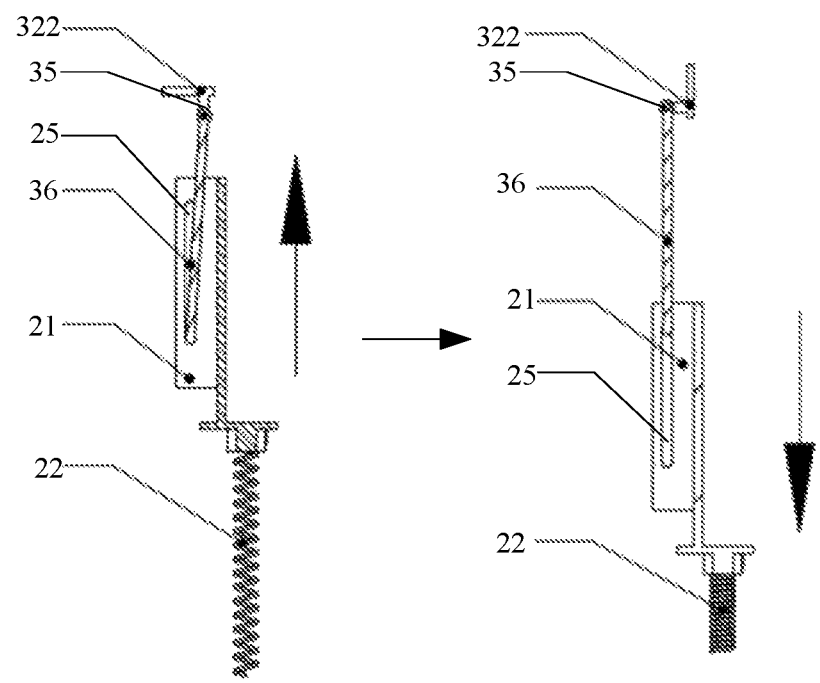
FIG. 14 illustrates a schematic diagram of a state of sliding of a connecting rod according to an embodiment of the present disclosure.

In an embodiment, referring to FIG. 11 again, the rear cover assembly 3 also includes a connecting rod 36. FIG. 14 illustrates a schematic diagram of a state of sliding of the connecting rod provided by an embodiment of the present disclosure. As shown in FIG. 14, third sliding grooves 25 are respectively provided on both sides of the support base 21, the connecting rod 36 is slidably mounted in the third sliding groove 25, one end of the connecting rod 36 is inserted into the second sliding groove 35, and the connecting rod 36 is configured to drive the blade 322 to rotate when the support base 21 slides.

When the display apparatus 200 is inserted into the receiving groove 12, the support base 21 slides downward under the action of the weight, the spring 22 is compressed and begins to be deformed, and the connecting rod 36 starts to move with the third sliding groove 25 of the support base 21 to drive the blade 322 to slide in the second sliding groove 35, so that the blade 322 is in the vertical state to expose the air outlet 34. When the display apparatus 200 is pulled out, the support base 21 is not affected by an external force and rebounds under the action of the spring 22, thereby pushing the connecting rod 36 to drive the blade 322 to move relatively and rotate, so that the blade 322 is in the horizontal state to cover the air outlet 34.

Figure 15:
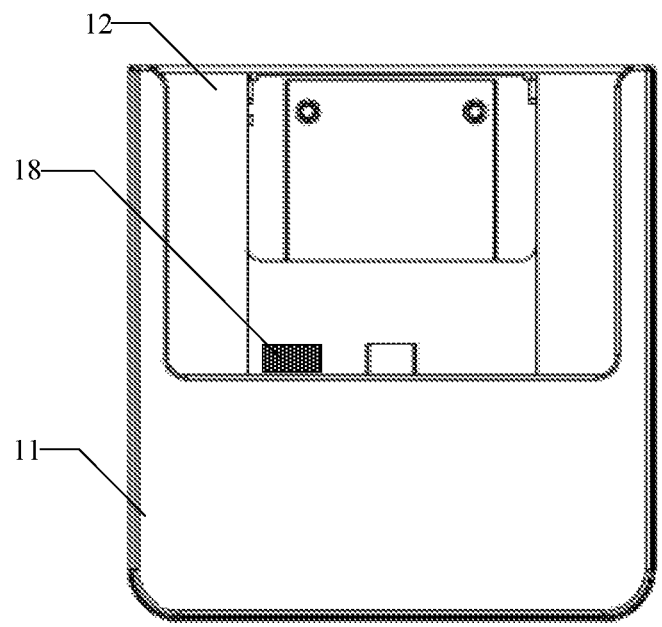
FIG. 15 illustrates a schematic diagram of a heat dissipation device according to an embodiment of the present disclosure.
Figure 16:
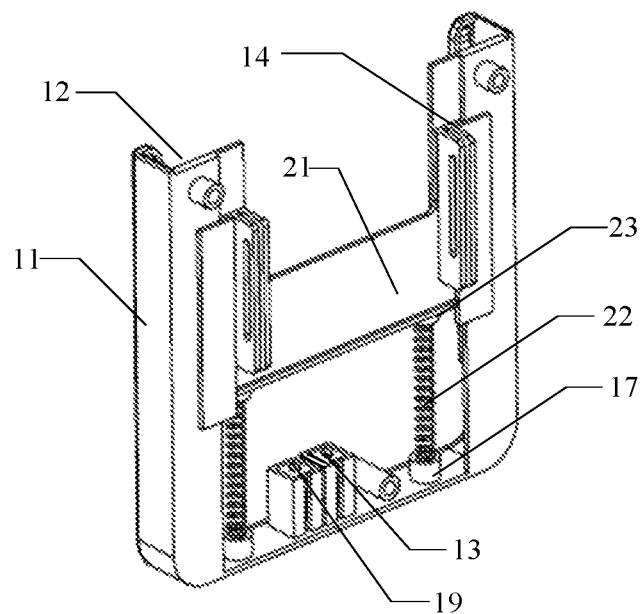
FIG. 16 illustrates a rear diagram of a heat dissipation device after assembling a front cover assembly and a support assembly according to an embodiment of the present disclosure.

FIG. 15 illustrates a schematic diagram of the heat dissipation device provided by an embodiment of the present disclosure, and FIG. 16 illustrates a rear diagram of the heat dispassion device after assembling the front cover assembly and the support assembly provided by the embodiment of the present disclosure. In an embodiment, as shown in FIG. 15 and FIG. 16, a weight sensor 18 is further provided at the bottom of the receiving groove 12 and configured to detect the weight of the display apparatus 200 after the display apparatus 200 is inserted. The front cover assembly 1 also includes a rotation speed control switch 19 configured to control a rotation speed of the fan 321 according to the weight detected by the weight sensor 18.

It can be understood that the heavier the body of the display apparatus 200 is, the larger the power consumption and the dissipated heat may be. Furthermore, according to different weight of the display apparatus 200, the fan 321 is controlled to blow air at different speeds, so that for the display apparatus 200 with a relatively small body weight and relatively low heat dissipation, the fan can rotate at a relatively small speed, while for the display apparatus 200 with a relatively large body weight and relatively high heat dissipation, the air can rotate at a relatively large speed, so that different degrees of heat dissipation are achieved for display apparatuses 200 of different weights, effectively reducing the power consumption of the fan 321.

In an embodiment, referring to FIG. 10 and FIG. 11 again, the rear cover 31 is provided with a battery limit groove 37, the rear cover assembly 3 further includes a battery 38, and the battery 38 is located in the battery limit groove 37 and is configured to charge (operate) the heat dissipation component 32. For example, when the heat dissipation component 32 includes the fan 321, the battery 38 is configured to charge (operate) the fan 321, which prolongs operating time of the fan 321 and optimizes the heat dissipation performance of the heat dissipation device.

Figure 17:
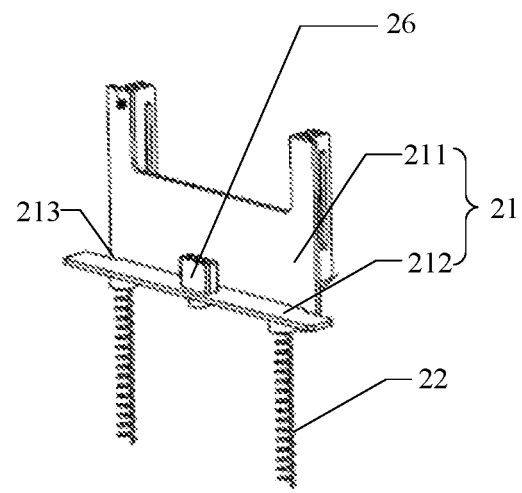
FIG. 17 illustrates a schematic diagram of a support assembly according to an embodiment of the present disclosure.
Figure 18:
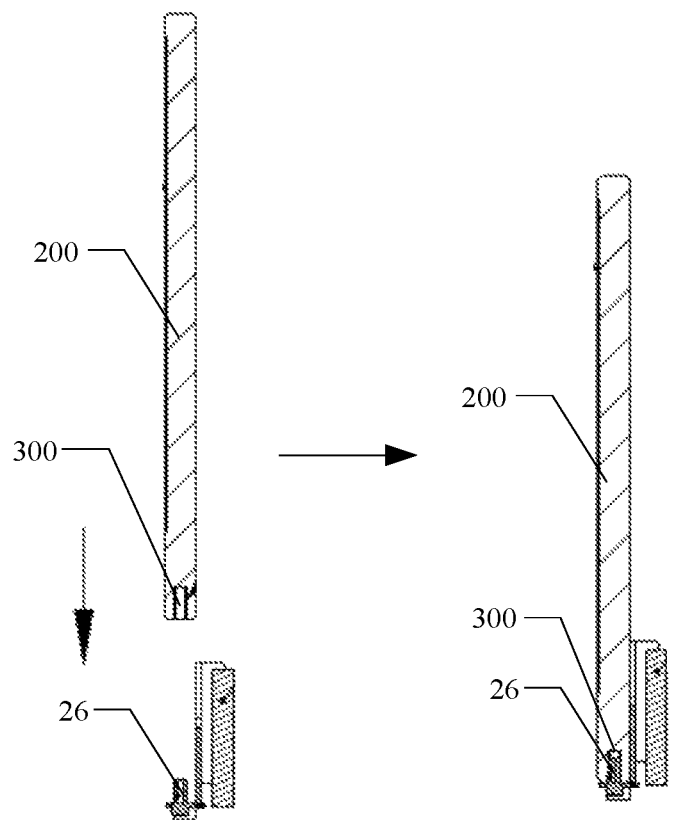
FIG. 18 illustrates a schematic diagram of a joint between a charging interface of a display apparatus and a charging interface of a heat dissipation device according to an embodiment of the present disclosure.

FIG. 17 illustrates a schematic diagram of the support assembly provided by the embodiment of the present disclosure, and FIG. 18 illustrates a schematic diagram of a joint between a charging interface of the display apparatus and a charging interface of the heat dissipation device provided by the embodiment of the present disclosure. In an embodiment, as shown in FIG. 17 and FIG. 18, the support assembly 2 further includes a charging interface 26 configured to joint with the charging interface 300 of the display apparatus 200 when the display apparatus 200 is inserted in the receiving groove 12, and to use the battery 38 to charge the display apparatus 200. With such configuration, the heat dissipation device 100 has functions of both heat dissipation and charging. After, the display apparatus 200 is inserted, in addition to using the fan 321 to achieve heat dissipation, the battery 38 can also be used to charge the display apparatus 200, so that the heat dissipation and the charging can be carried out simultaneously, which optimizes versatility of the heat dissipation device 100 and improves user experience.

In an embodiment, referring to FIG. 17 again, the support base 21 includes a support main body 211 and a support bottom plate 212. In some embodiments, there is a gap 213 between an end of the support bottom plate 212 and the support main body 211 to fit the second sliding groove 35, and the support bottom plate 212 is located inside the receiving groove 12. The charging interface 26 is provided on the support bottom plate 212, that is, when the display apparatus 200 is inserted, the display apparatus 200 is placed on the support bottom plate 212 to drive the support base 21 to move downward, and at the same time, the charging interface 300 of the display apparatus 200 is jointed with the charging interface 26 on the support bottom plate 212 to charge the display apparatus 200 of the battery 38.

In an embodiment, referring to FIG. 10 and FIG. 11 again, the rear cover assembly 3 further includes a protective cover 39, the protective cover 39 can be fixed on the rear cover 31 by a screw and form a closed cavity with the rear cover 31. The fan and battery 38 are located in the closed cavity, and, in this case, the closed cavity formed by the protective cover 39 and the rear cover 31 can be used to achieve a dust-proof effect. For instance, the fan and the battery 38 are located in the closed cavity, so that the dust can be prevented from falling into the fan 321 and the battery 38, which not only ensures that the fan 321 and the battery 38 are not dusted and remain clean, but also prevents the dust from falling into the fan 321 and the battery 38 and thus avoids affecting the components inside the fan 321 and the battery 38. In this case, the heat dissipation device 100 further has a dustproof function, which optimizes the versatility of the heat dissipation device 100.

In an embodiment, referring to FIG. 10 and FIG. 11 again, the protective cover 39 includes a fan protective cover 391 and a battery protective cover 392, the fan protective cover 391 covers the fan to prevent dust from falling into the fan 321, the battery protective cover 392 and the battery limit groove 37 form closed space for receiving the battery 38. The battery protective cover 392 tightly presses the battery 38 to prevent the dust from falling into the battery 38 on the one hand and to realize the pressing on the battery 38 on the other hand, such that the battery 38 is embedded in the battery limit groove 37, thereby improving the reliability of the battery 38 and preventing the battery 38 from falling off.

In an embodiment, in addition to playing a role of dust proofing, the protective cover 39 can also conduct the heat generated by the battery 38 to an outer side of the protective cover 39 by means of conduction. In this embodiment, the battery protective cover 392 can be formed of a metal material having a better heat dissipation effect to improve the heat dissipation performance of the protective cover 39. Exemplarily, the battery protective cover 392 can be a structure such as a copper sheet, aluminum sheet, or the like.

In an embodiment, referring to FIG. 11 again, the rear cover assembly 3 further includes a waterproof and breathable membrane 40, and the waterproof and breathable membrane 40 covers the air inlet 33 to prevent the water vapor from infiltrating through the air inlet 33 while achieving ventilation, so as to avoid the water vapor from affecting the internal components of the fan 321 and the battery 38. In this case, the heat dissipation device 100 further has a waterproof function, which optimizes the versatility of the heat dissipation device 100.

In an embodiment, referring to FIG. 11 again, the rear cover 31 is further provided with a limit flange 41 configured to limit an installation region of the waterproof and breathable membrane 40, which ensures that the waterproof and breathable membrane 40 completely covers the air inlet 33 to improve the waterproof effect.

In an embodiment, referring to FIG. 11 again, the installation region of the waterproof and breathable membrane 40 includes a breathable region 42 and an adhesion region 43, the breathable region 42 corresponds to the air inlet 33, and the adhesion region 43 surrounds the breathable region 42 and is configured to adhere the waterproof and breathable membrane 40. In this case, the waterproof and breathable membrane 40 can be adhered to the adhesion region 43 at an outer ring only, which prevents the glue from being coated in the breathable region 42, thereby avoiding clogging the air inlet 33 by the glue and improving the air inlet efficiency.

In addition, it should be noted that in the related art, heat dissipation, dustproof and waterproof designs of most heat dissipation devices 100 are considered separately and not considered as a whole, while in the embodiment of the present disclosure, the heat dissipation device 100 described above simultaneously has multiple functions such as heat dissipation, dustproof, and waterproof, thereby integration of multiple functions is realized. The heat dissipation device 100 is also protected against dust and water while having the heat dissipation function, preventing the internal components of the heat dissipation device from being adversely affected by external dust and water vapor, thereby prolonging a service life of the heat dissipation device 100.

Figure 19:
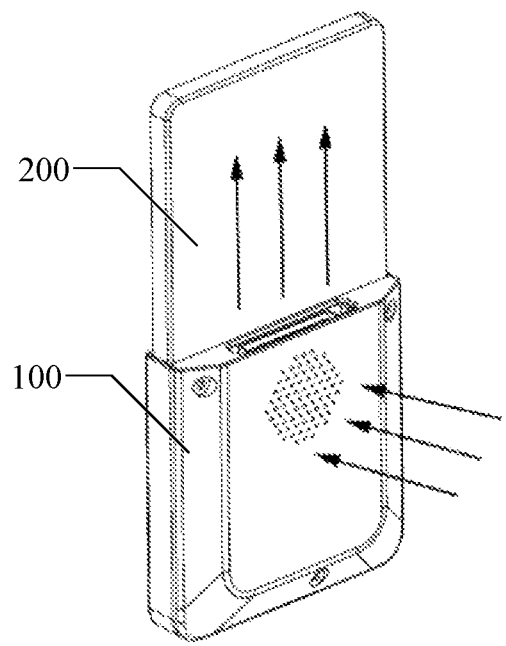
FIG. 19 illustrates a schematic diagram of a display device according to an embodiment of the present disclosure.

An embodiment of the present disclosure also provides a display device. FIG. 19 illustrates a schematic diagram of the display device provided by an embodiment of the present disclosure. As shown in FIG. 19, the display device includes the heat dissipation device 100 described above. The display apparatus 200 utilizes the heat dissipation device 100 for heat dissipation. The structure of the heat dissipation device 100 has been described in detail in the above-mentioned embodiments and will not be repeated herein. Moreover, the display apparatus 200 shown in FIG. 19 is only illustrative. In an embodiment of the present disclosure, the display apparatus 200 can be a handheld display apparatus such as a mobile phone, a tablet, or an electronic paper book.

Since the display device provided by the embodiment of the present disclosure includes the heat dissipation device 100 described above, adopting the display device can, when the display apparatus 200 is inserted into the heat dissipation device 100, use own weight of the display apparatus 200 to realize automatic heat dissipation of the heat dissipation device 100, and it is no longer necessary to manually turn on or off the heat dissipation device 100, which simplifies the control method and improves user experience.

It should be noted that, in conjunction with FIG. 2A and FIG. 2B, in the embodiments of the present disclosure, after the display apparatus 200 is inserted into the heat dissipation device 100, the heat dissipation device 100 does not block the display screen of the display apparatus 200. Therefore, while using the heat dissipation device 100 to dissipate the heat of the display apparatus 200, the user can also simultaneously operate the display apparatus 200, by for example, watching a video or page on the display apparatus 200 simultaneously, thereby improving user experience.

Figure 20:
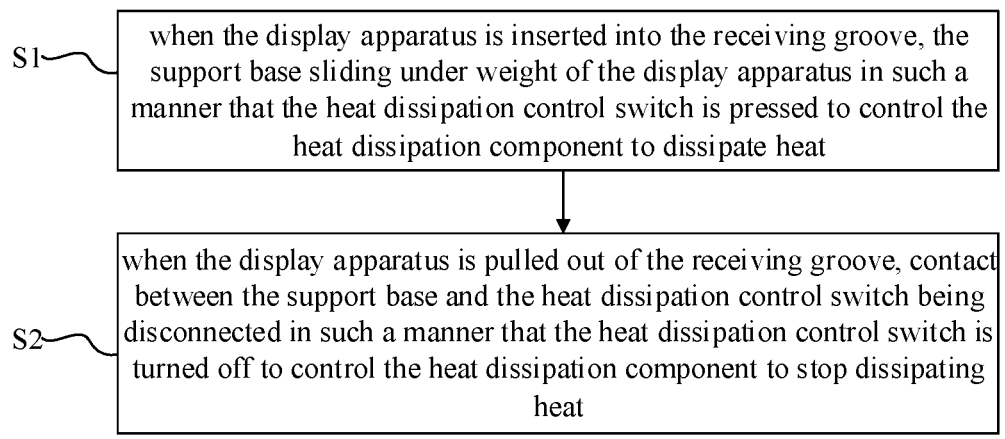
FIG. 20 illustrates a flowchart of a method for dissipating heat according to an embodiment of the present disclosure.

An embodiment of the present disclosure also provides a method for dissipating heat of the display apparatus 200, to use the heat dissipation device 100 to dissipate heat for the display apparatus 200. With reference to FIGS. 1A to 5, as shown in FIG. 20, FIG. 20 illustrates a flowchart of a method for dissipating heat provided by an embodiment of the present disclosure, and the method for dissipating heat includes steps S1 and S2.

At step S1, when the display apparatus 200 is inserted into the receiving groove 12, the support base 21 slides under the weight of the display apparatus 200 to press the heat dissipation control switch 13 to control the heat dissipation component 32 to dissipate heat.

At step S2, when the display apparatus 200 is pulled out of the receiving groove 12, contact between the support base 21 and the heat dissipation control switch 13 is disconnected, and the heat dissipation control switch 13 is turned off to control the heat dissipation component 32 to stop dissipating heat.

When the method for dissipating heat provided by the embodiment of the present disclosure is adopted and the heat dissipation device 100 is used to dissipate heat for the display apparatus 200, referring to FIGS. 6 and 7 again, the display apparatus 200 is inserted into the receiving groove 12 of the front cover assembly 1, and as the display apparatus 200 is inserted into the heat dissipation device 100 deeper, the support base 21 slides down in the first sliding groove 14 under the weight of the display apparatus 200. When the support base 21 slides to a certain position, the support base 21 touches the heat dissipation control switch 13 and presses the heat dissipation control switch 13, so that the heat dissipation control switch 13 is turned on, thereby controlling the heat dissipation component 32 to dissipate heat for the display apparatus 200. After the heat dissipation process is over, the display apparatus 200 is pulled out from the receiving groove 12, in this case, the support base 21 is not affected by an external force, and the support base 21 will rebound to the initial position, so that the support base 21 is not in contact with the heat dissipation control switch 13, and thus the heat dissipation control switch 13 is bounced up and turned off to control the heat dissipation component 32 to stop dissipating heat.

It can be seen that using the method for dissipating heat provided by the embodiment of the present disclosure can, when the display apparatus 200 is inserted into the receiving groove 12, utilize the weight of the display apparatus 200 itself to control the support base 21 to press the heat dissipation control switch 13 so as to realize automatic turning-on of the heat dissipation control switch 13, and can, when the display apparatus 200 is pulled out of the receiving groove 12, control the support base 21 to disconnect from contact with the heat dissipation control switch 13, so as to control automatic turning-off of the heat dissipation control switch 13. That is, the heat dissipation device 100 provided by the embodiment of the present disclosure can realize automatic heat dissipation based on the own weight of the display apparatus 200, and there is no need to manually turn on or off the heat dissipation control switch 13, thereby simplifying a control method and improving the user experience.

In an embodiment, referring to FIGS. 10-12, the heat dissipation component 32 includes a fan 321 and blades 322, the fan 321 is fixed on the rear cover 31, the air outlet 34 is provided with second sliding grooves 35 respectively located on both sides of the air outlet 34, and the blade 322 is rotatably installed on the second sliding groove 35.

Based on this structure, a heat dissipation process of the heat dissipation component 32 can include the following: the fan 321 blows air under control of the heat dissipation control switch 13, and the blade 322 rotates under the drive of the support base 21 to expose the air outlet 34.

With reference to FIG. 13 again, when the display apparatus 200 is not inserted into the receiving groove 12 or pulled out of the receiving groove 12, the blade 322 is in the horizontal state to block the air outlet 34, while when the display apparatus 200 is inserted into the receiving groove 12, the blade 322 slides in the second sliding groove 35, the blade 322 is in the vertical state after the rotation to expose the air outlet 34, while at the same time, the fan 321 blows air under the control of the heat dissipation control switch 13, to form a heat dissipation path between the air inlet 33 and the air outlet 34, such that the heat emitted by the display apparatus 200 is quickly exchanged with the outside atmosphere through the fan 321, to efficiently dissipate heat of the display apparatus 200.

In addition, it should be noted that when not using the heat dissipation device 100 for dissipating heat, the blade 322 is in the horizontal state to block the air outlet 34. In this case, the blade 322 can also have good dustproof and waterproof effects to prevent dust and water vapor from penetrating into inside of the heat dissipation device 100 from the air outlet 34, thereby preventing the dust and the water vapor from causing adverse effects on internal components of the heat dissipation device 100.

In an embodiment, referring to FIG. 10 and FIG. 11 again, the rear cover 31 of the heat dissipation device 100 is provided with a battery limit groove 37, the rear cover assembly 3 further includes a battery 38, and the battery 38 is located in the battery limit groove 37, and the support assembly 2 of the heat dissipation device 100 further includes a charging interface 26.

In an embodiment, based on such structure, the method for dissipating heat further includes the following: when the display apparatus 200 is inserted in the receiving groove 12, the charging interface is joined with the charging interface 300 of the display apparatus 200 to use the battery 38 to charge the display apparatus 200. In this case, the heat dissipation device 100 has functions of both heat dissipation and charging after the display apparatus 200 is inserted. In addition to using the fan 321 to achieve heat dissipation, the battery 38 can also be used to charge the display apparatus 200, so that the heat dissipation and the charging can be carried out simultaneously, which further optimizes versatility of the heat dissipation device 100 and improves user experience.

The above are only some embodiments of the present disclosure and are not intended to limit the present disclosure. Any modifications, equivalents, improvements, etc., which are made within the spirit and principles of the present disclosure, should be included in the scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A heat dissipation device of a display apparatus, comprising:
    a front cover assembly comprising a front cover, wherein the front cover is provided with a receiving groove and a heat dissipation control switch, wherein the receiving groove is configured to receive the display apparatus, and wherein the receiving groove is provided with first sliding grooves respectively on both sides of the receiving groove;
    a support assembly comprising a support base, wherein the support base is slidably mounted in the first sliding grooves and is located at a side of the heat dissipation control switch facing away from a bottom of the front cover; and
    a rear cover assembly comprising a rear cover and a heat dissipation component, wherein the rear cover is provided with an air inlet and an air outlet,
    wherein when the display apparatus is inserted into the receiving groove, the support base slides under weight of the display apparatus in such a manner that the heat dissipation control switch is pressed to control the heat dissipation component to dissipate heat.

2. The heat dissipation device according to claim 1, wherein the front cover assembly further comprises an anti-slip elastic piece arranged on an inner side of the receiving groove.

3. The heat dissipation device according to claim 1, wherein the front cover assembly further comprises a switch limit part provided at the bottom of the front cover, and the heat dissipation control switch is adhered to the switch limit part.

4. The heat dissipation device according to claim 3, wherein the support assembly further comprises:
    springs respectively arranged at both sides of the switch limit part; and
    first spring limit parts provided at a bottom of the support base,
    wherein the front cover comprises second spring limit parts arranged at the bottom of the front cover, one end of one of the springs is fixed on one of the first spring limit parts, and another end of the one of the springs is fixed on one of the second spring limit parts.

5. The heat dissipation device according to claim 3, wherein the support assembly further comprises buffers respectively located at both sides of the switch limit part;
    wherein one end of one of the buffers is fixed to a bottom of the support base, another end of the one of the buffers is fixed to the bottom of the front cover, and a maximum compression length of the one of the buffers is smaller than a height of the switch limit part.

6. The heat dissipation device according to claim 1, wherein the heat dissipation component comprises a fan and a blade, wherein the fan is fixed on the rear cover and configured to blow air under control of the heat dissipation control switch, second sliding grooves are respectively provided at both sides of the air outlet, and the blade is rotatably installed in the second sliding grooves and configured to rotate when the support base slides in such a manner that the air outlet is exposed.

7. The heat dissipation device according to claim 6, wherein the rear cover assembly further comprises connecting rods, wherein third sliding grooves are respectively provided on both sides of the support base, the connecting rods are respectively slidably mounted in the third sliding grooves, one end of each of the connecting rods is inserted into one of the second sliding grooves, and each of the connecting rods is configured to drive the blade to rotate when the support base slides.

8. The heat dissipation device according to claim 6, wherein the front cover assembly further comprises a weight sensor provided at a bottom of the receiving groove and configured to detect the weight of the display apparatus after the display apparatus is inserted; and
    the front cover assembly further comprises a rotation speed control switch, wherein the rotation speed control switch is configured to control a rotation speed of the fan based on the weight detected by the weight sensor.

9. The heat dissipation device according to claim 6, wherein the rear cover comprises a battery limit groove, the rear cover assembly further comprises a battery arranged in the battery limit groove and configured to charge the heat dissipation component.

10. The heat dissipation device according to claim 9, wherein the support assembly further comprises a charging interface configured to joint with a charging interface of the display apparatus when the display apparatus is inserted into the receiving groove in such a manner that the battery charges the display apparatus.

11. The heat dissipation device according to claim 10, wherein the support base comprises a support main body and a support bottom plate, wherein a gap is formed between an end of the support bottom plate and the support main body and is configured to fit with the second sliding groove, and the support bottom plate is located inside the receiving groove; and
    wherein the charging interface of the support assembly is arranged on the support bottom plate.

12. The heat dissipation device according to claim 9, wherein the rear cover assembly further comprises at least one protective cover, wherein the at least one protective cover is fixed on the rear cover and forms a closed cavity with the rear cover, and the fan and the battery are located in the closed cavity.

13. The heat dissipation device according to claim 12, wherein the at least one protective cover comprises a fan protective cover and a battery protective cover, wherein the fan protective cover covers the fan, the battery protective cover and the battery limit groove form a closed space for receiving the battery, and the battery protective cover presses the battery.

14. The heat dissipation device according to claim 1, wherein the rear cover assembly further comprises a waterproof and breathable membrane covering the air inlet.

15. The heat dissipation device according to claim 14, wherein the rear cover is further provided with a limit flange configured to limit a region where the waterproof and breathable membrane is arranged.

16. The heat dissipation device according to claim 14, wherein a region where the waterproof and breathable membrane is arranged comprises a breathable region and an adhesion region, wherein the breathable region corresponds to the air inlet, and the adhesion region surrounds the breathable region and is configured to adhere the waterproof and breathable membrane.

17. A display device, comprising:
a heat dissipation device; and
a display apparatus using the heat dissipation device to dissipate heat,
wherein the heat dissipation device comprises:
a front cover assembly comprising a front cover, wherein the front cover is provided with a receiving groove and a heat dissipation control switch, wherein the receiving groove is configured to receive the display apparatus, and the receiving groove is provided with first sliding grooves respectively on both sides of the receiving groove;
a support assembly comprising a support base, wherein the support base is slidably mounted in the first sliding grooves and is located at a side of the heat dissipation control switch facing away from a bottom of the front cover; and
a rear cover assembly comprising a rear cover and a heat dissipation component, wherein the rear cover is provided with an air inlet and an air outlet,
wherein when the display apparatus is inserted into the receiving groove, the support base slides under weight of the display apparatus in such a manner that the heat dissipation control switch is pressed to control the heat dissipation component to dissipate heat.

18. A method for dissipating heat of a display apparatus, comprising:
using a heat dissipation device to dissipate heat for the display apparatus,
wherein the heat dissipation device comprises:
a front cover assembly comprising a front cover, wherein the front cover is provided with a receiving groove and a heat dissipation control switch, wherein the receiving groove is configured to receive the display apparatus, and the receiving groove is provided with first sliding grooves respectively on both sides of the receiving groove;
a support assembly comprising a support base, wherein the support base is slidably mounted in the first sliding grooves and is located at a side of the heat dissipation control switch facing away from a bottom of the front cover; and
a rear cover assembly comprising a rear cover and a heat dissipation component, wherein the rear cover is provided with an air inlet and an air outlet,
wherein when the display apparatus is inserted into the receiving groove, the support base slides under weight of the display apparatus in such a manner that the heat dissipation control switch is pressed to control the heat dissipation component to dissipate heat; and
wherein said using the heat dissipation device to dissipate heat for the display apparatus comprises:
when the display apparatus is inserted into the receiving groove, the support base sliding under weight of the display apparatus in such a manner that the heat dissipation control switch is pressed to control the heat dissipation component to dissipate heat; and
when the display apparatus is pulled out of the receiving groove, contact between the support base and the heat dissipation control switch being disconnected in such a manner that the heat dissipation control switch is turned off to control the heat dissipation component to stop dissipating heat.

19. The method according to claim 18, wherein the heat dissipation component comprises a fan and a blade, wherein the fan is fixed on the rear cover, second sliding grooves are respectively provided at both sides of the air outlet, and the blade is rotatably installed in the second sliding grooves; and
wherein the heat dissipation component comprises:
the fan blowing air under control of the heat dissipation control switch; and
the blade being driven to rotate by the support base in such a manner that the air outlet is exposed.

20. The method according to claim 18, wherein the rear cover of the heat dissipation device is provided with a battery limit groove, the rear cover assembly further comprises a battery arranged in the battery limit groove, and the support assembly of the heat dissipation device further comprises a charging interface; and
wherein the method further comprises:
when the display apparatus is inserted into the receiving groove, the charging interface of the support assembly being jointed with a charging interface of the display apparatus in such a manner that the battery charges the display apparatus.

\* \* \* \* \*